United States Patent [19]

Hatwar

[11] Patent Number: 4,959,136
[45] Date of Patent: Sep. 25, 1990

[54] METHOD FOR MAKING AN AMORPHOUS ALUMINUM-NITROGEN ALLOY LAYER

[75] Inventor: Tukaram K. Hatwar, Rochester, N.Y.

[73] Assignee: Eastman Kodak Company, Rochester, N.Y.

[21] Appl. No.: 67,758

[22] Filed: Jun. 29, 1987

Related U.S. Application Data

[63] Continuation-in-part of Ser. No. 908,365, Sep. 17, 1986, Pat. No. 4,719,154.

[51] Int. Cl.⁵ ............................................. C23C 14/34
[52] U.S. Cl. ............................ 204/192.15; 204/192.16
[58] Field of Search ..................... 204/192.15, 192.16, 204/192.22

[56] References Cited

U.S. PATENT DOCUMENTS

| | | | |
|---|---|---|---|
| 3,461,054 | 8/1969 | Vratny | 204/192.15 |
| 3,600,218 | 8/1971 | Pennebaker | 204/192.15 X |
| 4,082,040 | 4/1978 | Yamashina et al. | 204/192.15 X |
| 4,384,933 | 5/1983 | Takasaki | 204/192.15 X |

Primary Examiner—Nam X. Nguyen
Attorney, Agent, or Firm—Warren W. Kurz

[57] ABSTRACT

Disclosed herein is a method for producing an amorphous aluminum nitride layer having a desired stoichiometry. Such method involves the steps of disposing a substrate in close proximity to an aluminum target in a low pressure atmosphere of nitrogen and an inert gas, and reactive sputtering an aluminum nitride layer onto the substrate at a certain minimum deposition rate while maintaining certain parameters (i.e. nitrogen-to-inert gas ratio, substrate temperature, sputtering power, nitrogen flow rate and sputtering pressure) within certain limits.

2 Claims, 5 Drawing Sheets

METHOD FOR MAKING AN AMORPHOUS ALUMINUM-NITROGEN ALLOY LAYER

This application is a continuation-in-part of application No. 908,365 filed Sept. 17, 1986, now U.S. Pat. No. 4,719,154.

BACKGROUND OF THE INVENTION

This invention relates to the field of magneto optic (MO) recording and, more particularly, to methods for producing aluminum nitride layers for use in magneto optic recording elements.

As used herein, "magneto optic recording element" refers to a multilayer structure used in the magneto optic write/read process for selectively modifying the characteristic of an incident polarized light beam in accordance with a magnetization pattern formed in a magneto optic recording layer which forms part of such structure. Typically, such recording element includes a substrate, a magneto optic recording layer (e.g. amorphous alloys of rare earth and transition metals) and one or more corrosion preventing, anti reflection layers of a dielectric or semi conductive material. A so called "bi-layer" recording element comprises a magneto optic layer having a single anti-reflection layer disposed on one surface thereof, the opposite surface of the magneto optic layer being contiguous with the supporting substrate (which is not counted in determining the number of layers). A "tri-layer" structure would include a second protective layer disposed between the substrate and the MO layer.

A primary function of the anti-reflection protective layer in an MO recording element is to enhance the magneto-optic rotation angle $\Theta_K$ caused by the well-known Kerr effect (in reflective systems) and Faraday effect (in transmission systems). As is well known, some of the more desirable MO materials exhibit a $\Theta_K$ of well less than 0.5°, and, without enhancement, the signal-to-noise ratio of the read-out signal, is marginal, at best. Another equally important function of the antireflection layer is to prevent corrosion of the contiguous MO layer. It is well known that some of the most promising MO layers (e.g. the aforementioned rare earth transition metal (RE-TM) alloys are environmentally unstable. That is, they exihibit little resistance to corrosion and oxidation which, of course, dramatically alters their magneto-optic properties.

In a 1984 article Published in the Japanese Journal of Applied Electronics, Vol. 8, No. 2, pp. 93–96, entitled "Study on High Reliability of a Magneto-optic Medium with a Multilayer Structure," K. Ohta et al disclose a tri layer recording element in which a rare earth transition metal (RE TM) thin film is sandwiched between a pair of corrosion-preventing layers made of crystalline aluminum nitride (AlN). These layers are supported by a glass substrate, and the exposed AlN layer is overcoated with a reflective layer (e.g. copper). As a result of this multilayer arrangement, the magneto optic-rotation angle $\Theta_K$, increased to 1.2 degrees, and the coercive force of the MO layer was relatively stable over time. While this enhanced value of $\Theta_K$ produces a relatively high figure of merit, $\Theta_K\sqrt{R}$, (where R is the power reflectivity of the recording element), the manufacture of such an element is relatively time consuming and, hence, costly. Moreover, the environmental stability of such elements is still far less than desirable.

SUMMARY OF THE INVENTION

An object of the invention is to provide a method for making the MO recording elements of the invention.

It has been discovered that amorphous films of aluminum nitride, particularly those having a stoichiometry of $Al_{1-x}N_x$, where x is between about 0.30 and 0.45, give rise to a substantially greater $\Theta_K$ and corrosion resistance than do the crystalline AlN layers of the prior art. According to the invention, there is provided a method for producing such films. Such method comprises a reactive sputtering step in which deposition rate, the nitrogen-to-inert gas ratio, the substrate temperature, the sputter power, the nitrogen flow rate, and the total pressure are precisely controlled.

The invention will be better understood from the ensuing detailed description of preferred embodiments, reference being made to the accompanying drawings wherein like reference characters denote like parts.

DETAILED DESCRIPTION OF PREFERRED EMBODIMENTS

Figure 1A:
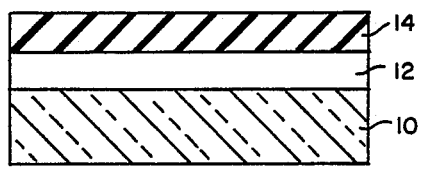
FIGS. 1A and 1B are cross sectional views of magneto optic recording elements.

Referring now to the drawings, FIG. 1A is a cross-sectional view of a bi layer magneto-optic recording element. Such recording comprises a substrate 10 which may, if desired, be a transparent material made of, for example, glass, polycarbonate, acetate or acrylic resin. Disposed atop substrate 10 is a magneto-optic thin film layer 12 which may comprise any material which imparts a Kerr or Faraday effect to incident polarized light. Preferably, however, recording layer 12 comprises a ternary alloy including a rare earth and transition metal. A particularly preferred MO media is a terbium-iron-cobalt (TbFeCo). Disposed atop recording layer 12 is an anti-reflection, corrosion preventing layer 14 of aluminum-nitrogen alloy $(Al_{1-x}N_x)$ thin film.

Figure 6:
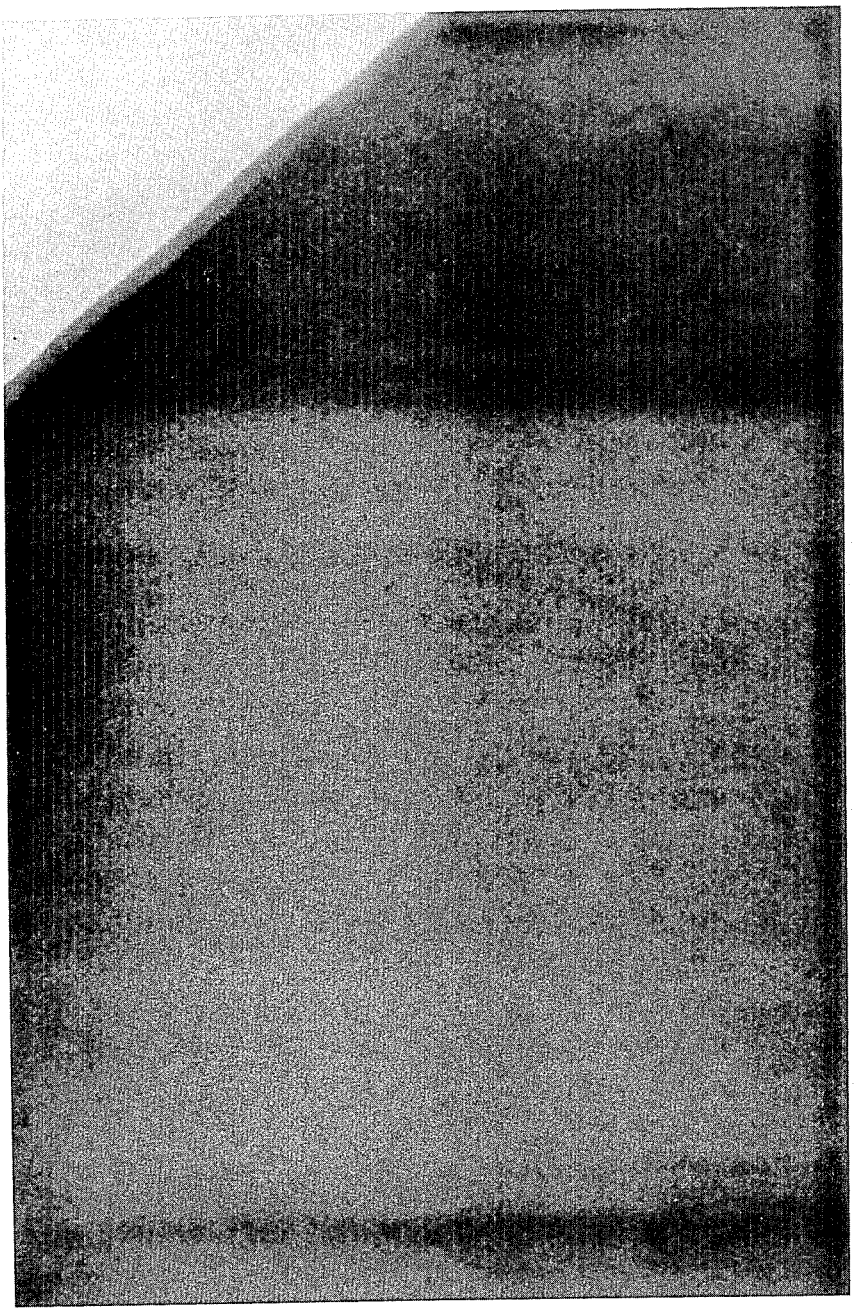
FIG. 6 is a transmission electron micrograph (TEM) at 250,000 X of an amorphous aluminum-nitrogen alloy thin film made in accordance with the method of the invention.
Figure 7:
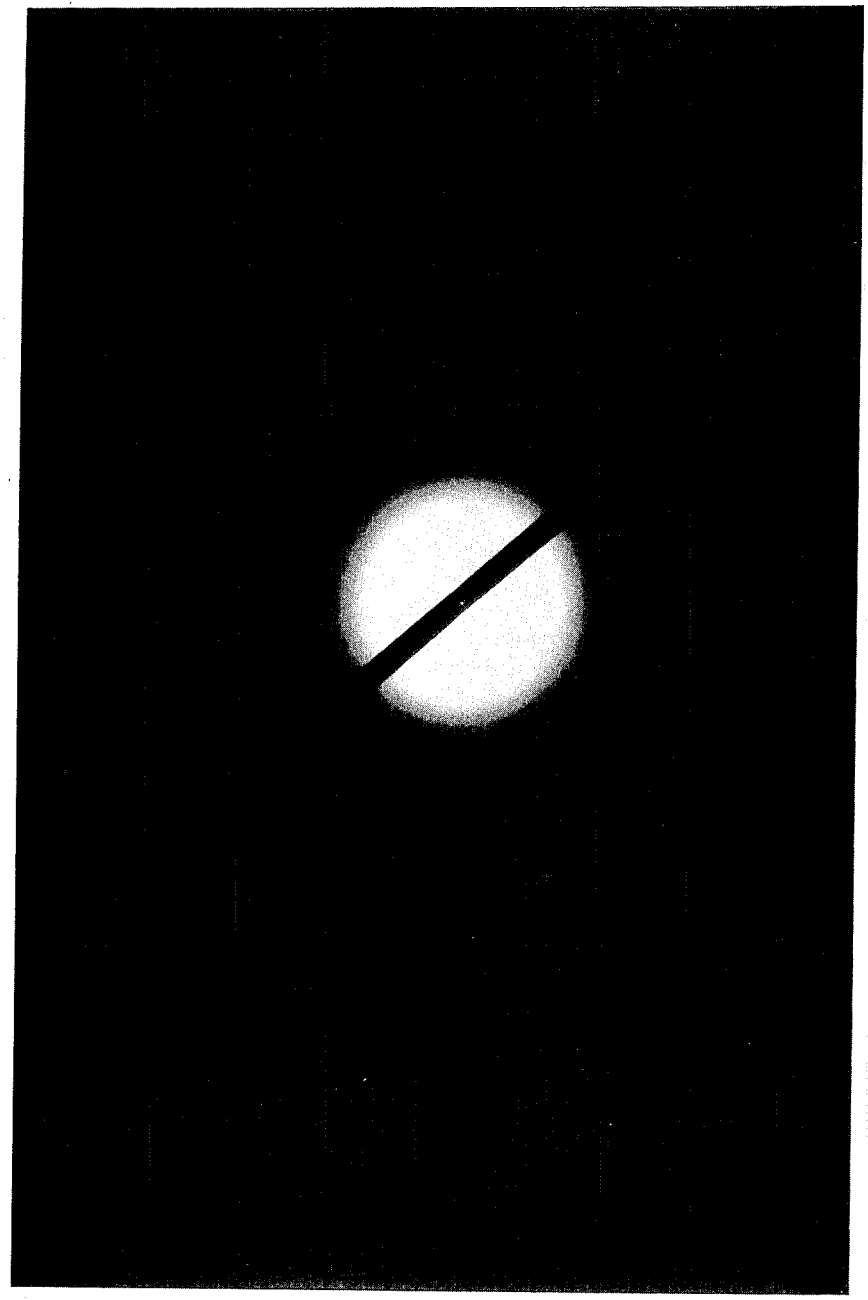
FIG. 7 is an electron beam diffraction pattern of a selected portion of the thin film shown in FIG. 6.

The $Al_{1-x}N_x$ layer of the FIG. 1A recording element is amorphous in character, that is, it is substantially free of any crystalline structure, as is evident in the photo micrograph and electron diffraction pattern of FIGS. 6 and 7. As such, there are no grain boundaries which would act as fast diffusion paths through which ambient gases can reach and react with the MO layer. Also, the absence of grain boundaries, has the effect of eliminating grain boundary noise which tends to reduce the performance (i.e., signal/noise ratio) of the recording element.

The compositional formula or stoichiometry of this amorphous layer can be represented by the formula $Al_{1-x}N_x$, where x is between about 0.30 and 0.45. It should be noted that this material is distinct from stoichiometric crystalline compound, AlN, with respect to its optical properties. For example, the refractive index of a thin (e.g. 60 nanometer) $Al_{1-x}N_x$ film on a Si substrate at 633 nm. wavelength is about 1.85, compared to about 2.05 for crystalline AlN. When using the recording element of FIG. 1A in a front surface write/read mode, the index 1.85 is a better match to typical MO media (n≈3.2) than the index (n=2.05) of crystalline AlN for antireflection effects. Assuming a front surface write/read mode in which incident medium is air, an optimum match (i.e. to achieve the maximum antireflection condition) is achieved when the refractive index of the overlayer is equal to the square root of the refractive index of the MO layer.

Figure 2:
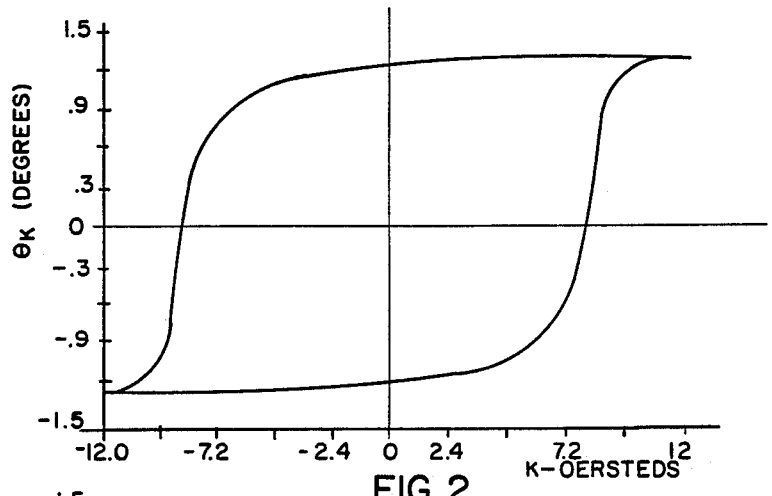
FIGS. 2 and 3 are Kerr hysteresis loops of a magneto-optic recording element (FIG. 1A) with and without an amorphous antireflection layer, respectively.
Figure 3:
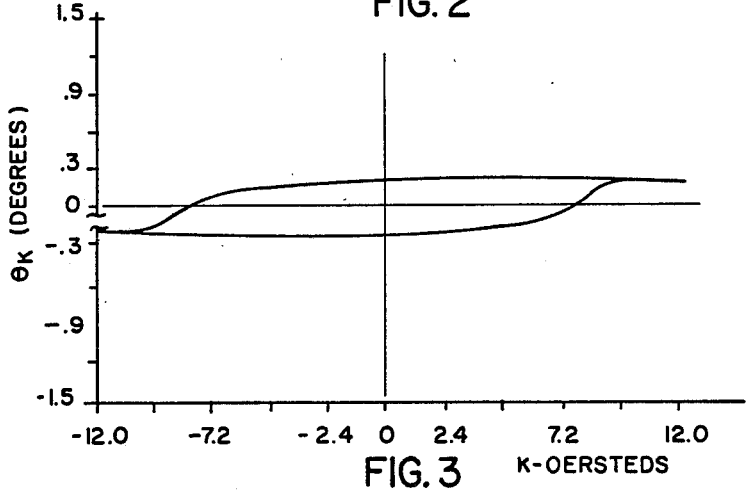

Referring to FIGS. 2 and 3, the Kerr hysteresis loop of an amorphous $Al_{1-x}N_x$ coated TbFeCo bi-layer recording element is shown in FIG. 2, while that of an uncoated TbFeCo is shown in FIG. 3. Note, with no applied field $2\Theta_K$ is approximately 2.33 degrees with the amorphous $Al_{1-x}N_x$ coated recording element, whereas $2\Theta_K$ for the uncoated element is only about 0.28 degrees.

Figure 4:
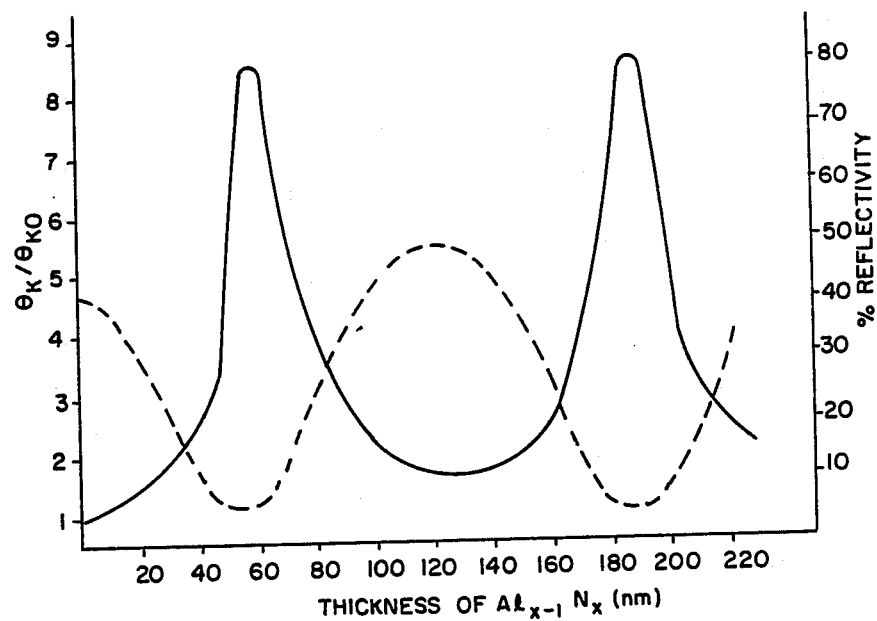
FIG. 4 illustrates the manner in which recording element reflectivity and magneto-optic rotation angle vary with thickness of the anti-reflective coating.

This overall enhancement by a factor of more than eight is believed to be the highest Kerr rotation enhancement observed so far in a simple bi layer recording element. It is quite comparable to that achieved in more complicated multilayer structures, such as reported in the aforementioned article by Ohta et al. The manner in which the reflectivity and Kerr enhancement vary with thickness of the $Al_{1-x}N_x$ layer is shown in FIG. 4. Here, the Kerr enhancement factor is represented by $\Theta_K/\Theta_{KO}$, where $\Theta_{KO}$ and $\Theta_K$ are Kerr rotation angles of an uncoated and coated recording element respectively. Preferably, the thickness of the $Al_{1-x}N_x$ overlayer is optimized by maximizing the aforementioned figure of merit, $\Theta_k\sqrt{R}$.

Figure 5:
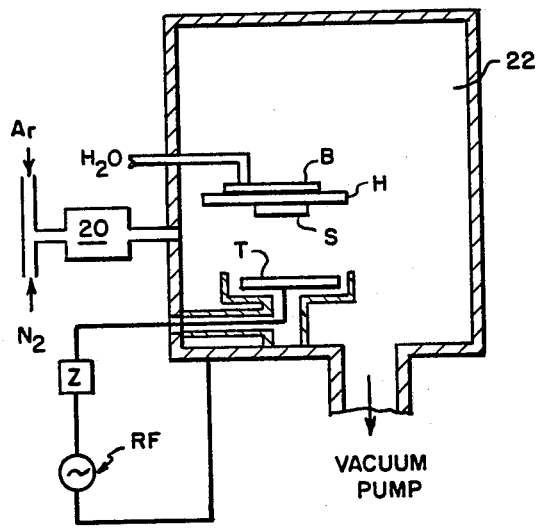
FIG. 5 schematically illustrates a reactive sputtering apparatus of the type used for carrying out the method of the invention.

According to a preferred embodiment of this invention, amorphous aluminum nitride thin films are prepared in a RF planar magnetron system by reactively sputtering an aluminum target (e.g. 99.9995% purity) in an argon nitrogen atmosphere. The general configuration for RF magnetron sputtering is shown in FIG. 5. As shown, argon and nitrogen gases are premixed in mixing chamber 20 before admission into a vacuum chamber 22. The substrate S, which is to receive the $Al_{1-x}N_x$ film, is positioned on a substrate holder H which, in turn, is positioned in thermal contact with a water cooled copper block B. The aluminum target T is spaced from substrate S by about 5 cm. The target is supported by a conventional planar magnetron (e.g. disclosed in U.S. Pat. No. 4,324,631) and is operatively coupled to the negative terminal of a two kilowatt A.C. Power source RF. The power applied to the target is controlled by a variable impedance Z. The vacuum chamber is pumped below $1 \times 10^7$ Torr before backfilling with ultrahigh purity argon and nitrogen. In order to minimize contamination in the deposited film, it is preferable to sputter clean the target in a conventional manner, while a shutter S' protects the substrate S from deposition. Such cleaning is carried out in two steps, first sputtering in a pure argon atmosphere for about 15 minutes, and then sputtering for 30 minutes in the desired gas mixture.

It has been found that the properties of the deposited $Al_{1-x}N_x$ films depend upon certain parameters of the RF sputtering system. One important parameter is the deposition rate which, of course, depends on the RF input power, target to substrate distance, substrate temperature, total sputtering pressure and the partial pressure of nitrogen, etc. In addition to the deposition rate, the following other parameters need be controlled to produce amorphous films: (a) the ratio of nitrogen to argon, (b) substrate temperature, (c) the sputtering power, (d) the reactive gas ($N_2$) flow rate, and (e) the total pressure. The following conditions have been found to give rise to amorphous $Al_{1-x}N_x$ films:
$N_2$:Ar Ratio - 30-50%
Substrate Temperature - <80° C.
Deposition Rate - >15 nanometer/minute
Putter Power - 600-1000 Watts
Nitrogen Flow Rate 3-6 sccm
Total Sputtering Pressure - 1-15 mTorr.

The best films, insofar as optical structure and corrosion resistance are concerned, were produced using an $N_2$:Ar ratio of about 50%, a sputter power of about 600 watts, a nitrogen flow of 3 sccm, a total sputtering pressure of 5 mTorr, a substrate temperature of 75° C. and a deposition rate of 16 nm/min.

When the $N_2$:Ar ratio was less than 20%, the film consists substantially of polycrystalline aluminum, and when the $N_2$:Ar ratio exceeded 50%, the films obtained are of microcrystalline aluminum-nitride. The desired stoichiometry mentioned above (i.e., $Al_{1-x}N_x$ films where x is between about 0.30 to 0.45) is achieved when the $N_2$:Ar ratio is between about 30% and 50%, and the other parameters are met.

During RF sputtering, the following general conditions were met:
Sputtering power - 300-2000 Watts
Sputtering gas Pressure - 1-30 mTorr
Background Pressure - $1 \times 10^{-7}$ Torr
$N_2$ flow rate - 3-6 sccm
Target to substrate distance - 5 cm.

Figure 1B:
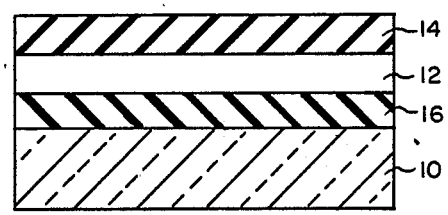

As indicated above, amorphous $Al_{1-x}N_x$ films can be advantageously used in more complex recording elements, such as the tri layer structure shown in FIG. 1B. When positioned on opposite sides of the magneto optic layer, the latter is protected from corrosion from both sides. The amorphous $Al_{1-x}N_x$ intermediate layer 16 prevents any absorbed water or impurities in the substrate 10 from migrating to the MO layer 12 causing the formation of metal hydroxides or oxides.

Figure 8:
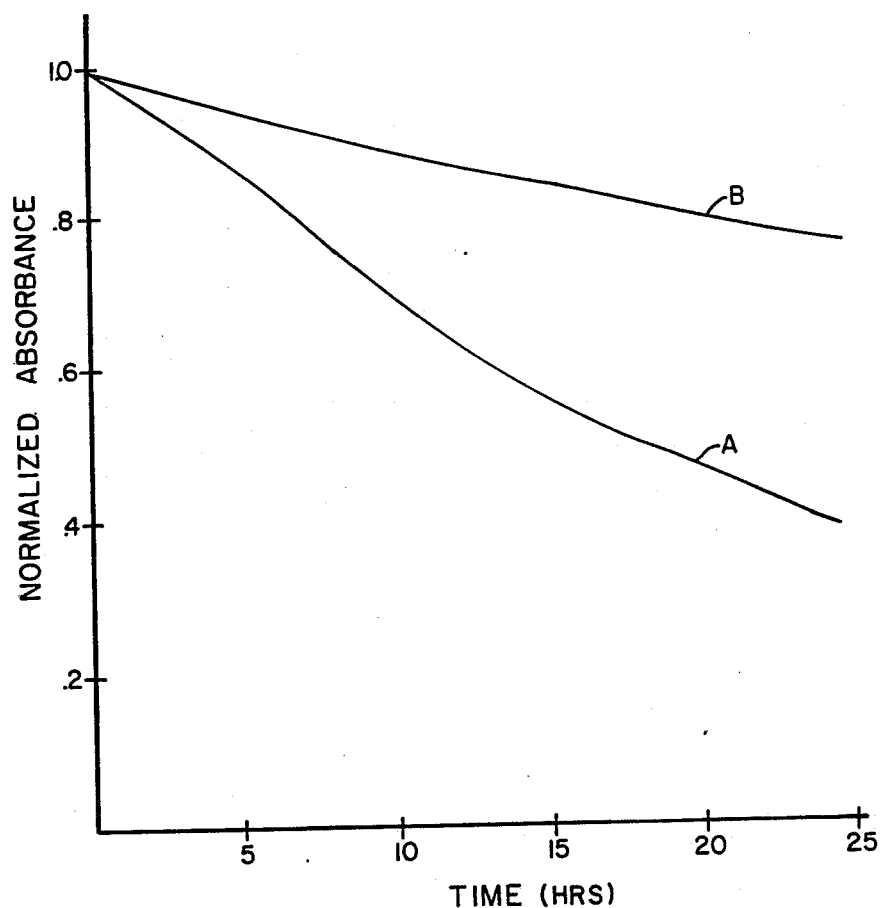
FIG. 8 is a graph illustrating the corrosion resistance properties of amorphous and crystalline aluminum nitride layers.

To illustrate the more corrosion resistance provided by the amorphous $Al_{1-x}N_x$ coatings over the crystalline films electrochemical corrosion tests were performed on two different TbFeCo films (100 nm thick), one coated with 100 nm of amorphous $Al_{1-x}N_x$ and the other coated with a 100 nm layer of crystalline AlN. These specimens were immersed in a 0.1 Molar chloroacetate/KCl buffer aqueous solution and their changes in light absorbance or transmittance were measured with light at 632 nm. Corrosion causes the growth of pin holes in the film. In order to express quantitatively, the degree of oxidation or corrosion, a measurement of the total area of pin holes is the best way. However, since the accurate measurement of pin hole area is difficult and time consuming, the optical absorbance/transmittance through the film provide an indirect measure of the total area of corrosion pits. FIG. 8 shows the absorbance change in the immersion test. The TbFeCo film with crystalline aluminum nitride coating shows (curve A) a marked decrease in absorbance in short term. During the immersion time of 24 hours, there was an absorbance decrease of more than 60% with crystalline coating while during the same period of time in the same conditions there was a decrease of absorbance by only 20% with the amorphous aluminum nitride coating (curve B). Thus it indicates that the TbFeCo media with amorphous aluminum nitride coating has better corrosion resistance. Similar results were obtained from potentio-dynamic polarization experiments carried out in the same solution. It was found that the amorphous aluminum nitride coating has corrosion resistance more than two times that of the crystalline aluminum nitride coating.

Since Al is very reactive to oxygen as it is possible that trace amounts of oxygen present in the sputtering chamber during film deposition may find its way into the $Al_{1-x}N_x$ film. Such modifications, if it occurs in these films, whether or not beneficial, is intended to be covered by this invention.

While the invention has been disclosed with particular reference to a Preferred embodiment, it will be apparent to those skilled in the art that modifications may be made without departing from the spirit and scope of the invention, as defined by the following claims.

I claim:

1. A method for producing an amorphous layer of an aluminum nitrogen alloy on a substrate, said method comprising the steps of:
   (a) disposing said substrate in close proximity to an aluminum target in a low pressure atmosphere of nitrogen and an inert gas;
   (b) reactive sputtering an aluminum nitrogen alloy onto said substrate at a rate exceeding 15 nanometers/min. while maintaining (i) the nitrogen to inert gas ratio between about 30 and 50%, (ii) the substrate temperature at less than about 80° C., (iii) the sputtering power between about 600 and 1000 Watts, (iv) the nitrogen flow rate between about 3 and 6 sccm, and (v) the total sputtering pressure between about 1 and 15 mTorr.

2. The method according to claim 1 herein the nitrogen to inert gas ratio is maintained at about 50%, the substrate temperature is maintained at about 75° C., the nitrogen flow rate is maintained at about 3 sccm, and the total sputtering pressure is maintained at about 5 mTorr.

* * * * *